United States Patent
Maruyama et al.

(10) Patent No.: US 10,930,442 B2
(45) Date of Patent: Feb. 23, 2021

(54) LIGHT-TRANSMITTING ELECTRODE HAVING CARBON NANOTUBE FILM, SOLAR CELL, METHOD FOR PRODUCING LIGHT-TRANSMITTING ELECTRODE HAVING CARBON NANOTUBE FILM, AND METHOD FOR MANUFACTURING SOLAR CELL

(71) Applicants: The University of Tokyo, Tokyo (JP); Aalto University, Aalto (FI)

(72) Inventors: Shigeo Maruyama, Tokyo (JP); Yutaka Matsuo, Tokyo (JP); Il Jeon, Tokyo (JP); Kehang Cui, Tokyo (JP); Esko I Kauppinen, Aalto (FI); Albert G Nasibulin, Aalto (FI)

(73) Assignees: University of Tokyo, Tokyo (JP); Aalto University, Aalto (FI); Denso Corporation, Kariya (JP)

( * ) Notice: Subject to any disclaimer, the term of this patent is extended or adjusted under 35 U.S.C. 154(b) by 0 days.

(21) Appl. No.: 15/507,935

(22) PCT Filed: Sep. 2, 2015

(86) PCT No.: PCT/JP2015/074999
§ 371 (c)(1),
(2) Date: Jul. 7, 2017

(87) PCT Pub. No.: WO2016/035832
PCT Pub. Date: Mar. 10, 2016

(65) Prior Publication Data
US 2017/0316887 A1    Nov. 2, 2017

(30) Foreign Application Priority Data

Sep. 2, 2014 (JP) .............................. JP2014-178204

(51) Int. Cl.
*H01G 9/20* (2006.01)
*H01L 51/00* (2006.01)
(Continued)

(52) U.S. Cl.
CPC ......... *H01G 9/2027* (2013.01); *H01G 9/2059* (2013.01); *H01L 51/0036* (2013.01);
(Continued)

(58) Field of Classification Search
CPC . H01L 31/00; H01L 51/0048; H01L 51/0036; H01L 51/444; H01L 51/4253;
(Continued)

(56) References Cited

U.S. PATENT DOCUMENTS 6,048,621 A * 4/2000 Gallego .............. C03C 17/3417
428/34
2005/0079118 A1   4/2005 Maruyama et al.
(Continued)

FOREIGN PATENT DOCUMENTS

JP    2010-093099    4/2010
JP    2010-534409    11/2010
(Continued)

OTHER PUBLICATIONS

Tao et al, Semitransparent inverted polymer solar cells with MoO3/Ag/MoO3 as transparent electrode, 2009.*
(Continued)

*Primary Examiner* — Uyen M Tran
(74) *Attorney, Agent, or Firm* — Fish & Richardson P.C.

(57) ABSTRACT

The present invention provides a light-transmitting electrode which has high electrical conductivity and high electron blocking performance. The present invention also provides a solar cell which is capable of achieving high energy conversion efficiency at low cost. The present invention provides a method for producing a light-transmitting elec-
(Continued)

trode that has a light-transmitting substrate, a carbon nanotube film which is formed directly or indirectly on the light-transmitting substrate, and a metal oxide film which is formed directly on the carbon nanotube film. This production method includes vapor depositing the metal oxide film, which contains oxygen and a metal element belonging to the group 4, 5 or 6 of the periodic table, on one surface or both surfaces of the carbon nanotube film. The present invention provides a light-transmitting electrode which includes a light-transmitting substrate and a conductive carbon nanotube film that is formed directly or indirectly on the light-transmitting substrate.

1 Claim, 1 Drawing Sheet

(51) Int. Cl.
H01L 51/42 (2006.01)
H01L 51/44 (2006.01)

(52) U.S. Cl.
CPC ...... H01L 51/0037 (2013.01); H01L 51/0043 (2013.01); H01L 51/0047 (2013.01); H01L 51/0048 (2013.01); H01L 51/0077 (2013.01); H01L 51/4253 (2013.01); H01L 51/444 (2013.01); H01L 2251/303 (2013.01); H01L 2251/305 (2013.01); H01L 2251/308 (2013.01); Y02E 10/549 (2013.01); Y02P 70/50 (2015.11)

(58) Field of Classification Search
CPC ............. H01L 51/0077; H01L 51/0043; H01L 51/0037; H01L 2251/305; H01L 2251/303; H01L 2251/308; Y02E 10/549; Y02E 10/542
See application file for complete search history.

(56) References Cited

U.S. PATENT DOCUMENTS

| | | | | |
|---|---|---|---|---|
| 2006/0060825 A1* | 3/2006 | Glatkowski | ............ | B82Y 10/00 252/500 |
| 2008/0163927 A1* | 7/2008 | Sohn | ............ | B82Y 10/00 136/263 |
| 2008/0308151 A1* | 12/2008 | Den Boer | ............ | H01L 31/02168 136/256 |
| 2010/0282309 A1 | 11/2010 | Pschirer et al. | | |
| 2011/0139253 A1 | 6/2011 | Wachi et al. | | |
| 2012/0204939 A1* | 8/2012 | Lee | ............ | H01L 31/043 136/249 |
| 2015/0075622 A1* | 3/2015 | Bazan | ............ | H01L 51/0036 136/263 |
| 2015/0207090 A1 | 7/2015 | Lassiter et al. | | |
| 2015/0228371 A1* | 8/2015 | Kim | ............ | H01J 1/304 174/253 |

FOREIGN PATENT DOCUMENTS

| | | | |
|---|---|---|---|
| JP | 2011-142318 | 7/2011 | |
| JP | 2012-080091 | 4/2012 | |
| JP | 2013-118127 | 6/2013 | |
| JP | 2014-162672 | 9/2014 | |
| WO | 2003/068676 | 8/2003 | |
| WO | WO2012/002113 | 1/2012 | |
| WO | 2013/187482 | 12/2013 | |
| WO | 2014/022580 | 2/2014 | |
| WO | WO2014045021 | * 3/2017 | ............ H01L 31/00 |

OTHER PUBLICATIONS

Inverted polymer solar cells integrated with a low temperature annealed sol-gel derive film as an electron transport layer (Year: 2011).*

J. Du et al., "25$^{th}$ Anniversary Article: Carbon Nanotube- and Graphene-Based Transparent conductive Films for Optoelectronic Devices", *Advanced Materials*, vol. 26, (2014) pp. 1958-1991.

S. L. Hellstrom, et al., "Strong and Stable Doping of Carbon Nanotubes and Graphene by MoO$_x$ for Transparent Electrodes," *Nano Letters*, vol. 12 (2012)pp. 3574-3580.

Z. Li, et al., "Laminated Carbon Nanotube Networks for Metal Electrode-Free Efficient Perovskite Solar Cells," *ACS Nano*, vol. 8, (2014) pp. 6797-6804.

I. Jeon, et al., "Direct and Dry Deposited Single-Walled Carbon Nanotube Films Doped with MoO$_x$ as Electron-Blocking Transparent Electrodes for Flexible Organic Solar Cells," *Journal of American Chemical Society*, vol. 137, (2015) pp. 7982-7985.

International Search Report issued for PCT/JP2015/074999 dated Oct. 13, 2015, with English translation.

Written Opinion issued for PCT/JP2015/074999 dated Oct. 13, 2015, with English translation.

Decision of Refusal in Japanese Application 2016-0546681 dated Jul. 7, 2020, with English translation downloaded from Global Dossier.

* cited by examiner

LIGHT-TRANSMITTING ELECTRODE HAVING CARBON NANOTUBE FILM, SOLAR CELL, METHOD FOR PRODUCING LIGHT-TRANSMITTING ELECTRODE HAVING CARBON NANOTUBE FILM, AND METHOD FOR MANUFACTURING SOLAR CELL

TECHNICAL FIELD

The present invention relates to a light-transmitting electrode having a carbon nanotube film and a method for producing the same. The present invention further relates to a solar cell obtained by using the light-transmitting electrode and a method for producing the same.

BACKGROUND ART

Conventionally, solar cells including a polycrystal silicon have been developed and put to practical use. The production of such solar cells requires a high-purity silicon, and the production process thereof requires a high temperature process. Accordingly, in consideration of energy required for the production of solar cells including a polycrystal silicon, it cannot be necessarily said that the degree of contribution to energy saving techniques is sufficiently high.

In addition, the preparation of an element on a plastic substrate, which is required for solar cells other than general solar cells to be used for generating electricity outside, also has problems.

Recently, in order to improve the above-described problems, solar cells including an organic material which can be produced in an energy saving state and at low cost have been developed. In solar cells, indium tin oxide (ITO) is widely used as a light-transmitting electrode. Since indium is a rare element, from the viewpoint of availability and price, a light-transmitting electrode to be used instead of ITO has been desired.

Carbon nanotube films are expected to be used as a material for a light-transmitting electrode, but do have sufficiently high electrical conductivity. In this regard, it is known to dope a carbon nanotube with a Bronsted acid such as sulfuric acid and nitric acid or the like in order to improve electrical conductivity of a carbon nanotube film. However, doping with nitric acid or the like is a very dangerous operation. In addition, the energy conversion efficiency of organic thin-film solar cells having a light-transmitting electrode including a carbon nanotube doped with nitric acid or the like was just 2 to 3% (Non-Patent Document 1).

Further, a light-transmitting electrode, which is produced by forming a molybdenum oxide film on a light-transmitting substrate and adding carbon nanotube powder thereto, is also known (Non-Patent Document 2). However, such a light-transmitting electrode does not have sufficient electrical conductivity or the like and therefore is not appropriate for use for a solar cell.

Further, it is known to form a carbon nanotube structure, wherein titanium oxide is carried by or covered with a carbon nanotube, on a substrate and to use this for an electrode of a solar cell (Patent Document 1).

Further, regarding carbon nanotubes, a carbon nanotube having a single-walled structure and a method for producing the same are known (Patent Document 2 and Patent Document 3).

PRIOR ART DOCUMENTS

Patent Documents

Patent Document 1: Japanese Laid-Open Patent Publication No. 2013-118127
Patent Document 2: Japanese Laid-Open Patent Publication No. 2014-162672
Patent Document 3: WO 2003/068676 A1

Non-Patent Documents

Non-Patent Document 1: J. Du et al. Adv. Mater. 2014, 26, 1958
Non-Patent Document 2: Nano Letters 2012, 12, 3574-3580

SUMMARY OF THE INVENTION

Problems to be Solved by the Invention

Under the above-described circumstances, a light-transmitting electrode having high electrical conductivity and high electron blocking performance has been desired. Further, a solar cell having high energy conversion efficiency at low cost has been desired.

Means for Solving the Problems

The present inventors achieved an invention of a light-transmitting electrode in which a metal oxide film is formed in contact with a carbon nanotube film and an invention of a method for producing the same. Further, the present inventors achieved an invention of a solar cell that has: a light-transmitting electrode having a light-transmitting substrate and a conductive carbon nanotube film which is formed on the light-transmitting substrate; an active layer made of a compound having a perovskite structure; and an electrode which is formed on the active layer.

The present invention includes, for example, inventions according to embodiments as follows:

[1] A light-transmitting electrode that has:
a light-transmitting substrate;
a carbon nanotube film which is formed directly or indirectly on the light-transmitting substrate; and
a metal oxide film which is formed directly on the carbon nanotube film, the metal oxide film containing oxygen and a metal element belonging to the group 4, 5 or 6 of the periodic table.
[2] The light-transmitting electrode according to item [1], wherein the metal element is molybdenum.
[3] The light-transmitting electrode according to item [1] or [2], wherein the metal oxide film is a vapor-deposited film.
[4] The light-transmitting electrode according to any one of items [1] to [3], wherein another metal oxide film is further provided between the light-transmitting substrate and the carbon nanotube film.
[5] A solar cell that has:
an active layer which is formed directly or indirectly on the metal oxide film of the light-transmitting electrode according to any one of items [1] to [4]; and
an electrode which is formed directly or indirectly on the active layer.
[6] The solar cell according to item [5], which has a buffer layer between the active layer and the electrode.
[7] The solar cell according to item [5] or [6], wherein the active layer is made of a $CH_3NH_3PbI_3$ compound or $CH_3NH_3PbI_{3-x}Cl_x$ compound having a perovskite structure, and wherein in the formula, x is 1 to 3.

[8] The solar cell according to item [5], wherein the electrode formed directly or indirectly on the active layer is a light-transmitting electrode including an ITO film.

[9] A method for producing a light-transmitting electrode that has: a light-transmitting substrate; a carbon nanotube film which is formed directly or indirectly on the light-transmitting substrate; and a metal oxide film which is formed directly on the carbon nanotube film, the method including vapor depositing the metal oxide film, which contains oxygen and a metal element belonging to the group 4, 5 or 6 of the periodic table, on one surface or both surfaces of the carbon nanotube film.

[10] The production method according to item [9], wherein the metal element is molybdenum.

[11] A method for producing a solar cell that has: a light-transmitting substrate; a carbon nanotube film which is formed directly or indirectly on the light-transmitting substrate; a metal oxide film which is formed directly on the carbon nanotube film; an active layer which is formed directly or indirectly on the metal oxide film; a buffer layer which is formed on the active layer; and an electrode which is formed on the buffer layer, the method including:

vapor depositing the metal oxide film, which contains oxygen and a metal element belonging to the group 4, 5 or 6 of the periodic table, on one surface or both surfaces of the carbon nanotube film.

[12] The production method according to item [11], wherein the active layer is made of a $CH_3NH_3PbI_3$ compound or $CH_3NH_3PbI_{3-x}Cl_x$ compound having a perovskite structure, and wherein in the formula, x is 1 to 3.

[13] The production method according to item [11] or [12], wherein the electrode formed on the buffer layer is a light-transmitting electrode including an ITO film.

[14] A solar cell that has:

a light-transmitting electrode having a light-transmitting substrate and a conductive carbon nanotube film which is formed directly or indirectly on the light-transmitting substrate;

an active layer made of a compound having a perovskite structure, wherein the active layer is formed on the light-transmitting electrode; and an electrode which is formed on the active layer.

[15] The solar cell according to item [14], which further has a PEDOT:PSS layer on the carbon nanotube film.

[16] A light-transmitting electrode that has:

a light-transmitting substrate; and a conductive carbon nanotube film which is formed directly or indirectly on the light-transmitting substrate.

In this specification, the wording "formed on a layer or film" includes the case of being formed in contact with and directly on a layer or film and the case of being formed indirectly via another layer, unless otherwise specified.

Advantageous Effect of the Invention

A light-transmitting electrode according to a preferred embodiment of the present invention exhibits high electrical conductivity and high electron blocking performance. In a production method according to a preferred embodiment of the present invention, high electrical conductivity and high electron blocking performance can be simultaneously imparted to a carbon nanotube film.

Further, a method for producing a light-transmitting electrode or solar cell according to a preferred embodiment of the present invention is safe and can be carried out at low cost, and the environmental load is small.

DETAILED DESCRIPTION OF THE INVENTION

1 Light-Transmitting Electrode

Figure 1:
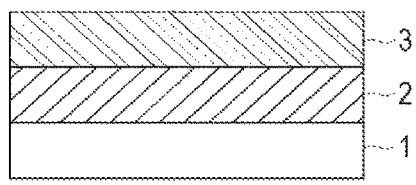
FIG. 1 is a schematic cross sectional view showing a light-transmitting electrode of the present invention.

As shown in FIG. 1, a light-transmitting electrode 10 of the present invention includes a light-transmitting substrate 1, a carbon nanotube film 2 and a metal oxide film 3. Hereinafter, the structure thereof will be described.

(1) Light-Transmitting Substrate

The light-transmitting substrate 1 is not particularly limited as long as it is a substrate having light-transmitting property. For example, it is possible to use a transparent glass substrate made of quartz, soda-lime glass, non-alkali glass or the like, a ceramic substrate and a light-transmitting plastic substrate. Examples of the light-transmitting plastic substrate include substrates made of polyethylene terephthalate, polyethylene naphthalate, polyether sulfone, polyimide, nylon, polystyrene, polyvinyl alcohol, an ethylene vinyl alcohol copolymer, a fluororesin film, vinyl chloride, or polyolefin such as polyethylene, cellulose, polyvinylidene chloride, aramid, polyphenylene sulfide, polyurethane, polycarbonate, polyarylate, polynorbornene, an epoxy resin or the like.

The shape of the light-transmitting substrate 1 is not limited. For example, a light-transmitting substrate having a plate-like shape, a film-like shape, a sheet-like shape or the like can be used. Further, the thickness of the light-transmitting substrate 1 is not limited, but in general, it is preferably 5 μm to 20 mm, and more preferably 20 μm to 10 mm. When the thickness of the substrate is 5 μm or more, it is preferred because the possibility that the strength of an organic thin-film solar cell element is insufficient is low. When the thickness of the substrate is 20 mm or less, it is preferred because the cost can be reduced and the weight can be reduced.

When the light-transmitting substrate 1 is made of glass, in general, the thickness thereof is preferably 0.01 mm to 10 mm, and more preferably 0.1 mm to 5 mm.

(2) Carbon Nanotube Film

The carbon nanotube film can be produced by a publicly-known method such as the arc discharge method, the laser vaporization method and the CVD method.

In the arc discharge method, arc discharge is performed between carbon rods under argon or hydrogen atmosphere having a pressure slightly lower than atmospheric pressure, thereby producing a multi-walled carbon nanotube in a cathode deposit.

In the laser vaporization method, carbon mixed with a catalyst such as Ni/Co is irradiated with a strong pulsed light such as YAG laser under a high temperature atmosphere at 900° C. to 1300° C., thereby producing a carbon nanotube.

In the CVD method, a carbon compound as a carbon source is brought into contact with fine particles of a catalyst metal at 500° C. to 1200° C., thereby producing a carbon nanotube. The type of the catalyst metal and the arrangement thereof, the type of the carbon compound, etc. respectively vary, and by changing conditions, both a multi-walled carbon nanotube and a single-walled carbon nanotube can be synthesized. Further, by arranging the catalyst on the substrate, a multi-walled carbon nanotube or single-walled carbon nanotube aligned vertical to the substrate surface can be obtained.

The carbon nanotube film 2 is not particularly limited as long as it has light-transmitting property. The carbon nanotube of the carbon nanotube film 2 may be aligned vertical or non-vertical to the substrate surface. As the carbon nanotube film 2, commercially-available films can be utilized, but among them, a single-walled carbon nanotube (SWCNT) film is preferably used.

Further, in the present invention, the carbon nanotube film 2 may be a conductive carbon nanotube film or a dopant-containing carbon nanotube film.

Electrical conductivity may be imparted to the carbon nanotube film 2 by inclusion of a metal oxide film containing oxygen and a metal element belonging to the group 4, 5 or 6 of the periodic table in the carbon nanotube film 2.

Electrical conductivity may be imparted to the carbon nanotube film 2 by doping the carbon nanotube film 2 with an acid (e.g., nitric acid, sulfuric acid, phosphoric acid, etc.). Further, a film of a conductive polymer such as poly-(3,4-ethylenedioxythiophene)-polystyrenesulfonic acid (PEDOT:PSS) may be formed on the carbon nanotube film 2 (or carbon nanotube film 2 doped with an acid), thereby imparting electrical conductivity to a layer in which the carbon nanotube film 2 and the conductive polymer film exist in a mixed manner.

SWCNT can be prepared by the aerosol chemical vapor deposition method using a floating catalyst by ferrocene vapor decomposition under carbon monoxide atmosphere (Moisala, A.; Nasibulin, A. G.; Brown, D. P.; Jiang, H.; Khriachtchev, L.; Kauppinen, E. I. Single-Walled Carbon Nanotube Synthesis Using Ferrocene and Iron Pentacarbonyl in a Laminar Flow Reactor. Chem. Eng. Sci. 2006, 61, 4393-4402.; Nasibulin, A. G.; Brown, D. P.; Queipo, P.; Gonzalez, D.; Jiang, H.; Kauppinen, E. I. An Essential Role of $CO_2$ and $H_2O$ during Single-Walled CNT Synthesis from Carbon Monoxide. Chem. Phys. Lett. 2006, 417, 179-184.). Specifically, in the aerosol chemical vapor deposition method for the production of SWCNT, carbon monoxide gas at normal temperature is passed through a cartridge into which ferrocene powder is put, thereby obtaining catalyst precursor vapor. The fluid containing ferrocene vapor is passed through a water-cooled probe to be introduced into a high-temperature region of a ceramic tube reactor and mixed with additional carbon monoxide gas. In order to obtain a stably-grown SWCNT film, a controlled amount of carbon dioxide is also added to a carbon source (carbon monoxide). The SWCNT film is accumulated in the lower portion of the reactor using a nitrocellulose or silver membrane film (Millipore Corp., USA; HAWP, 0.45 μm pore diameter). In this way, the SWCNT film can be prepared on the membrane film.

According to a method other than the aforementioned aerosol chemical vapor deposition method, a carbon source consisting of an oxygen-containing compound or a mixture of an oxygen-containing compound and a carbon-containing compound is brought into contact with a catalyst under reduced pressure at a heating temperature, thereby producing SWCNT (Chemical Vapor Deposition) (S. Maruyama*, R. Kojima, Y. Miyauchi, S. Chiashi and M. Kohno, "Low-Temperature Synthesis of High-Purity Single-Walled Carbon Nanotubes from Alcohol," Chem. Phys. Lett., (2002), 360, (3-4), 229-234.; WO2003/068676).

Further, a construct having a substrate and a vertically-aligned carbon nanotube film formed on the substrate is immersed in water at a temperature 25° C. or more higher, preferably 30° C. or more higher, and more preferably 35° C. or more higher than the temperature of the construct to delaminate the vertically-aligned carbon nanotube film, thereby producing a single-walled or multi-walled carbon nanotube film (Y. Murakami, Y. Miyauchi, S. Chiashi and S. Maruyama*, "Direct synthesis of high-quality single-walled carbon nanotubes on silicon and quartz substrates," Chem. Phys. Lett., (2003), 377, (1-2), 49-54.; Y. Murakami, S. Chiashi, Y. Miyauchi, M. Hu, M. Ogura, T. Okubo, S. Maruyama*, "Growth of vertically aligned single-walled carbon nanotube films on quartz substrates and their optical anisotropy," Chem. Phys. Left., (2004), 385, (3-4), 298-303.; Japanese Laid-Open Patent Publication No. 2007-182342).

In general, the thickness of the carbon nanotube film 2 is not particularly limited, but it is preferably 5 nm to 100 nm.

Further, the carbon nanotube film 2 may be formed on the light-transmitting substrate 1 directly or via another film.

(3) Metal Oxide Film

The metal oxide film 3 is not particularly limited as long as it is a film containing oxygen and a metal element belonging to the group 4 (titanium, zirconium, hafnium), the group 5 (vanadium, niobium, tantalum) or the group 6 (chromium, molybdenum, tungsten) of the periodic table, but it is particularly preferred to use molybdenum as the metal.

Further, the metal oxide film 3 is preferably a vapor-deposited film. This is because, when using a vapor-deposited film formed by vacuum deposition, a metal film can be formed uniformly on the surface of the carbon nanotube film 2, and the effect of smoothing an uneven surface of the carbon nanotube film 2 is high.

The metal oxide film 3 is formed at least on a surface closer to the active layer 5, but is preferably formed on both the surfaces of the carbon nanotube film 2.

The thickness of the metal oxide film 3 is preferably 1 nm to 50 nm, and more preferably 5 nm to 15 nm.

2 Solar Cell

Figure 2:
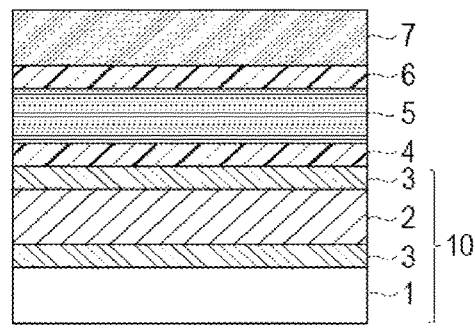
FIG. 2 is a schematic cross sectional view showing a solar cell in one working example of the present invention.

A solar cell according to a preferred embodiment of the present invention includes a light-transmitting substrate, a carbon nanotube film, a metal oxide film, an active layer, a buffer layer (optional) and an opposed electrode. As shown in FIG. 2, a solar cell 20 according to a preferred embodiment of the present invention is an element wherein a buffer layer 4, an active layer 5, a buffer layer 6 and an opposed electrode 7 are further formed in this order on the metal oxide film 3 of the light-transmitting electrode 10 of the present invention. The solar cell of the present invention is not limited as long as it is a solar cell having: a light-transmitting electrode that has a light-transmitting substrate, a carbon nanotube film which is formed directly or indirectly on the light-transmitting substrate and a metal oxide film which is formed directly on the carbon nanotube film, the metal oxide film containing oxygen and a metal element belonging to the group 4, 5 or 6 of the periodic table; an active layer which is formed directly or indirectly on the metal oxide film of the light-transmitting electrode; and an electrode which is formed directly or indirectly on the active layer.

Hereinafter, the structure thereof will be described.

(1) Active Layer

The active layer 5 is not particularly limited as long as it contains a substance capable of performing photoelectric conversion, but is generally a layer containing an electron acceptor compound and an electron donor compound. When the active layer 5 is irradiated with light, the light is absorbed into the active layer 5, electron transfer occurs at the interface between the electron acceptor compound and the electron donor compound, electrons and electron holes are generated, and the generated electrons and electron holes are respectively taken out from electrodes at both the sides.

As a material for the active layer 5, either an inorganic compound or an organic compound may be used, but it is preferred to use an organic compound.

Examples of the electron donor compound include: condensed aromatic hydrocarbons such as naphthacene, pentacene or pyrene; thiophenes containing a thiophene ring such as α-sexithiophene (polythiophenes); condensed polycyclic aromatic compounds such as pentacene or tetracene; phthalocyanine compounds and metal complexes thereof, or porphyrin compounds such as tetrabenzoporphyrin and metal complexes thereof, macrocyclic compounds such as naphthalocyanine derivatives and porphyrin derivatives, conjugated polymer semiconductors such as polyfluorene, polyphenylene vinylene, polythienylene vinylene, polyacetylene or polyaniline; oligomer semiconductors such as oligothiophene in which an alkyl group or another substituent is substituted; and organic dyes such as diketopyrrolopyrrole derivatives or squaraine derivatives. Further, specific examples of the electron donor compound include benzoporphyrin (BP), polythiophene, polyphenylene, polyphenylene vinylene, polysilane, polycarbazole, polyvinyl carbazole, porphyrin, polyacethylene, polypyrrole, polyaniline, polyfluorene, polyvinyl pyrene, polyvinyl anthracene, thiophene-fluorene copolymer, polyalkylthiophene, phenylene ethynylene-phenylene vinylene copolymer, phenylene ethynylene-thiophene copolymer, phenylene ethynylene-fluorene copolymer, fluorene-phenylene vinylene copolymer, thiophene-phenylene vinylene copolymer, phthalocyanine-containing polymer, carbazole-containing polymer or organometallic polymer.

Examples of the electron acceptor compound include: fullerene or fullerene derivatives; condensed cyclic tetracarboxylic diimides such as naphthalene tetracarboxylic diimide or perylene tetracarboxylic diimide; and condensed polycyclic aromatic hydrocarbons such as perylene derivatives, thiazole derivatives, benzothiazole derivatives and benzothiadiazole derivatives. Further, specific examples of the electron acceptor compound include polyphenylene vinylene, polyfluorene, derivatives thereof, copolymers thereof, carbon nanotube (CNT), fullerene derivatives such as phenyl-$C_{61}$-butyric acid methyl ester (PCBM), cyano (CN) group- or trifluoromethyl ($CF_3$) group-containing polymer, $CF_3$ group-substituted polymer, 2,3,5,6-tetrafluoro-7,7,8,8-tetracyanoquinodimethane (F4TCNQ), 7,7,8,8-tetracyanoquinodimethane (TCNQ), 1,4,5,8-naphthalenetetracarboxylic dianhydride (NTCDA) and perylene-3,4,9,10-tetracarboxylic dianhydride (PTCDA). Examples of the fullerene derivatives include hydrogenated fullerene, fullerene oxide, fullerene hydroxide, aminated fullerene, fullerene sulfide, halogenated (F, Cl, Br, I) fullerene, fulleroid, methanofullerene, pyrrolidinofullerene, alkylated fullerene or arylated fullerene.

In this specification, examples of the "fullerene" include fullerene $C_{60}$ (so-called buckminsterfullerene), fullerene $C_{70}$, fullerene $C_{76}$, fullerene $C_{78}$, fullerene $C_{82}$, fullerene $C_{84}$, fullerene $C_{90}$, fullerene $C_{94}$ and fullerene $C_{96}$.

Examples of the structure of the active layer 5 include: (1) a heterojunction type wherein a layer made of the electron donor compound and a layer made of the electron acceptor compound are laminated to utilize charge transfer caused by photoinduction at the joint interface; and (2) a bulk-heterojunction type which has a layer in which the electron acceptor compound and the electron donor compound are mixed.

Regarding the heterojunction type active layer, a layer made of the electron donor and a layer made of the electron acceptor are laminated to utilize charge transfer caused by photoinduction at the joint interface. For example, in the heterojunction type active layer, copper phthalocyanine can be used as the electron donor compound and a perylene derivative can be used as the electron acceptor compound. Moreover, in the heterojunction type active layer, a condensed polycyclic aromatic compound such as pentacene or tetracene can be used as the electron donor compound and a fullerene such as $C_{60}$ or a fullerene derivative can be used as the electron acceptor compound.

Regarding a bulk-heterojunction type active layer, the junction of the electron donor compound and the electron acceptor compound uniformly exists in a bulk of a mixed active layer, and light can be effectively used thereby. Examples of the method for preparing this bulk-heterojunction type element include a method of codepositing the electron donor compound and the electron acceptor compound by means of vacuum deposition to form an active layer (vacuum deposition method) and a method of applying a mixed solution of both the compounds by means of spin coating or a printing method to form an active layer (wet coating method). Examples of active layers which can be formed by the vacuum deposition method include an active layer made of copper phthalocyanine and fullerene. Typical examples of active layers which can be formed by the wet coating method include: an active layer wherein poly(3-hexylthiophene) (P3HT) that is a conjugated polymer is mixed with [6,6]-phenyl C61-butyric acid methyl ester (PCBM) that is a fullerene soluble derivative; an active layer wherein PTB7 (poly(thieno[3,4-b]thiophene/benzodithiophene)) is mixed with PC71BM ([6,6]-phenyl C71-butyric acid methyl ester); and an active layer wherein P3HT (regioregular, Sigma Aldrich Chemical Co., Inc.) is mixed with mix-PCBM (Frontier Carbon Co., Nanom spectra E124).

Further, a compound having a perovskite structure (perovskite compound) can be used for the active layer 5. Examples of the perovskite compound include compounds of $CH_3NH_3PbI_{3-x}Cl_x$ (in the formula, x is 1 to 3), $CH_3NH_3PbBr_3$, $CH_3NH_3PbBrI_2$, $CH_3NH_3PbBr_2I$, $CH_3NH_3SnBr_3$, $CH_3NH_3SnI_3$, $CH(=NH)NH_3PbI_3$, $(C_2H_5NH_3)_2PbI_4$, $(CH_2=CHNH_3)_2PbI_4$, $(CH\equiv CNH_3)_2PbI_4$, $(C_6H_5NH_3)_2PbI_4$, $(C_6H_3F_2NH_3)_2PbI_4$, $(C_6F_5NH_3)_2PbI_4$, $(C_4H_3SNH_3)_2PbI_4$, etc. Among these compounds, a $CH_3NH_3PbI_3$ compound or $CH_3NH_3PbI_{3-x}Cl_x$ compound (in the formula, x is 1 to 3) is preferably used for the active layer 5.

Regarding the bulk-heterojunction type active layer, in order to further improve the conversion efficiency, the active layer may have a p-i-n-type three-layer structure which consists of an electron donor layer (active layer (p-layer)), a layer in which the electron donor compound and the electron acceptor compound are mixed (active layer (i-layer)) and an electron acceptor layer (active layer (n-layer)).

The thickness of the active layer 5 is not particularly limited, but it is 10 nm to 1000 nm, and preferably 50 nm to 500 nm. When the thickness of the active layer 5 is 10 nm or more, the thickness uniformity can be maintained and a short circuit is not easily caused, and therefore it is preferred. Further, when the thickness of the active layer 5 is 1000 nm or less, the internal resistance becomes smaller and the distance between electrodes is not too large, resulting in good charge diffusion, and therefore it is preferred.

Note that the active layer 5 may be formed on the metal oxide film 3 directly or via the buffer layer 4.

(2) Buffer Layer

A buffer layer (4, 6) can be formed on one surface or both surfaces of the active layer.

In order to selectively transport charge (electron holes and electrons) generated by light absorption to the electrode efficiently to obtain high conversion efficiency, the buffer layer (4, 6) may be formed between the cathode and the active layer or between the anode and the active layer.

Between the anode and the active layer, a conductive polymer is often used, and examples thereof include poly-(3,4-ethylenedioxythiophene)-polystyrenesulfonic acid (PEDOT:PSS). Such substances have hole transport performance (or electron blocking performance).

Further, between the cathode and the active layer, it is possible to form a cathode buffer layer containing an inorganic substance such as calcium and lithium fluoride, bathocuproine (BCP), a compound having a cinnoline skeleton represented by formula (I) below, a compound represented by formula (II) below, or the like.

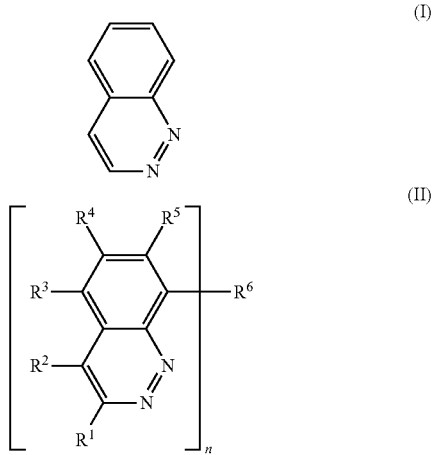

Accordingly, in the solar cell of the present invention, when the opposed electrode 7 is a cathode, the buffer layer 6 is a cathode buffer layer, and the buffer layer 4 is an anode buffer layer.

For example, when an anode buffer layer 4 is formed between the active layer 5 and the metal oxide film 3, i.e., on the metal oxide film 3, pinholes of the metal oxide film 3 are closed by the buffer layer 4, thereby obtaining a flattened film, and electron blocking performance of the metal oxide film 3 can be enhanced thereby.

Further, when a cathode buffer layer 6 is formed between the active layer 5 and the opposed electrode 7, i.e., on the active layer 5, the buffer layer 6 can enhance exciton blocking performance or hole blocking performance. For the buffer layer, it is possible to use compounds of CdS, ZnS, Zn(S, O) and/or Zn(S, O, OH), SnS, Sn(S, O) and/or Sn(S, O, OH), InS, In(S, O) and/or In(S, O, OH), $TiO_2$, $In_2S_3$, etc.

(3) Electrode, Etc.

The solar cell 20 has a pair of electrodes (cathode, cathode). It is possible to employ the case where the carbon nanotube film 2 functions as the cathode and the opposed electrode 7 is the anode, and it is also possible to employ the case where the carbon nanotube film 2 functions as the anode and the opposed electrode 7 is the cathode.

When the opposed electrode 7 is the cathode, as a material for the cathode, a metal such as platinum, gold, silver, copper, iron, tin, aluminium, calcium or indium, or an alloy containing one type of the aforementioned metal, or a conductive oxide containing a publicly-known metal such as indium tin oxide, is preferably used.

The cathode may be a metal plate or a film formed by the vacuum film formation method such as the vapor deposition method or the sputtering method or by the wet coating method wherein an ink containing nanoparticles or a precursor is applied to form a film.

Although not shown in FIG. 2, in the solar cell 20 of the present invention, a weather-resistant protective film, an ultraviolet protective film, a gas barrier film, a getter material film, a sealing material, a back sheet, etc. may be further formed.

(4) Organic Solar Cell

The solar cell of the present invention is preferably an organic solar cell such as an organic thin-film solar cell and a dye-sensitized solar cell.

3 Methods for Producing Light-Transmitting Electrode and Solar Cell 3.1 Method for Producing Light-Transmitting Electrode The light-transmitting electrode 10 can be produced by carrying out a step of fixing the carbon nanotube film 2 on the light-transmitting substrate 1 and a step of forming the metal oxide film 3.

(1) Step of Fixing Carbon Nanotube Film on Substrate

In order to remove a foreign material adhered to the light-transmitting substrate 1, the light-transmitting substrate 1 is washed with a surfactant, organic solvent or the like, and then dried in an oven or the like. After that, in order to more surely remove the foreign material adhered to the light-transmitting substrate 1, UV-ozone treatment is preferably carried out additionally.

Next, the carbon nanotube film 2 is transferred onto the light-transmitting substrate 1 after removal of the foreign material. The carbon nanotube film is placed on the light-transmitting substrate and then pressed thereto, thereby performing the transfer.

When using, as the light-transmitting substrate 1, a glass substrate on which no film is formed, in order to improve the fixed power of the carbon nanotube film 2 onto the glass substrate, it is preferred to drop an alcohol such as ethanol on the light-transmitting substrate before the carbon nanotube film is placed thereon. Note that the amount of the alcohol to be dropped is preferably within a range in which photoelectric conversion characteristics of the light-transmitting electrode 10 or solar cell which can be prepared later are not affected thereby. Specifically, note that when a large amount of the alcohol is dropped, molybdenum oxide may be dissolved.

It is also possible to fix the carbon nanotube film with the metal oxide film being formed on one surface or both surfaces thereof in advance onto the substrate. The method for forming the metal oxide film on the carbon nanotube film is preferably vacuum deposition as described in (2) below.

(2) Step of Forming Metal Oxide Film

The substrate on which the carbon nanotube film 2 is formed is put into a device fabrication apparatus to which a vacuum deposition apparatus is connected, and the metal oxide is vacuum deposited on the carbon nanotube film 2. The deposition rate is preferably 0.01 nm/sec to 0.3 nm/sec, and more preferably 0.01 nm/sec to 0.1 nm/sec.

Annealing is preferably carried out after vacuum deposition. Annealing is preferably carried out at 100° C. to 400° C. for 5 minutes to 200 minutes. Further, annealing may be carried out twice or more. By carrying out the step of forming the metal oxide film in this way, the metal oxide film is formed directly on the carbon nanotube film that is formed on the light-transmitting substrate directly or indirectly, but the interface between the carbon nanotube film and the metal oxide film may be in a state where both the components are mixed.

As the carbon nanotube film to be fixed to the substrate, a film where the metal oxide film is formed on the surface thereof in advance can be used. In this case, the metal oxide film is formed on one surface or both the surfaces of the carbon nanotube film 2 of the light-transmitting electrode.

When the metal oxide film 3 is formed on one surface or both the surfaces of the carbon nanotube film 2 in this way, the carbon nanotube film 2 is hole-doped and electrical conductivity and electron blocking performance of the carbon nanotube film 2 are improved, thereby providing the light-transmitting electrode 10 having excellent characteristics.

According to another embodiment, it is possible to vacuum deposit the metal oxide film on the light-transmitting substrate 1, followed by formation of the carbon nanotube film thereon.

3.2 Method for Producing Solar Cell

A solar cell according to a preferred embodiment of the present invention can be prepared by forming a buffer layer 4, an active layer 5, a buffer layer 6 and an opposed electrode 7 on the metal oxide film 3 of the light-transmitting electrode 10 in order.

(1) Step of Forming Buffer Layer (1)

It is preferred to form the buffer layer 4 on the metal oxide film 3 of the light-transmitting electrode 10 of the present invention.

For the purpose of closing pinholes of the metal oxide film 3 to obtain a flat film and supporting electron blocking performance of the metal oxide, an aqueous dispersion of poly-(3,4-ethylenedioxythiophene)-polystyrenesulfonic acid (PEDOT:PSS) (Clevios PVP, Heraeus Precious Metals GmbH & Co.) or the like is applied onto the metal oxide film 3 by spin coating or the like, thereby preparing the buffer layer 4.

(2) Step of Forming Active Layer

The active layer 5 is formed on the metal oxide film 3 of the light-transmitting electrode 10 of the present invention or on the buffer layer 4.

When using a fullerene derivative for the active layer 5, the fullerene derivative is dissolved in an organic solvent such as o-dichlorobenzene to prepare a fullerene derivative solution, and after complete dissolution, the active layer 5 is prepared using spin coating.

(3) Step of Forming Buffer Layer (2)

It is preferred to form the buffer layer 6 on the active layer 5.

The method for forming the buffer layer 6 is not particularly limited, but when using an inorganic substance such as calcium and lithium fluoride for the buffer layer, it is preferred to use the vacuum deposition method. Specifically, after the active layer 5 is formed, it is put into a device fabrication apparatus to which a vacuum deposition apparatus is connected, and the inorganic substance such as calcium and lithium fluoride as the raw material can be vacuum deposited on the active layer 5.

(4) Step of Forming Opposed Electrode

The method for forming the opposed electrode 7 is not particularly limited, but when using a metal such as aluminium for the opposed electrode 7, it is preferred to use vacuum deposition. Specifically, after the buffer layer 6 is formed, it is put into a device fabrication apparatus to which a vacuum deposition apparatus is connected, and a metal such as aluminium is preferably vacuum deposited on the active layer 5.

Thus, the step of forming the buffer layer 4, the step of forming the active layer 5, the step of forming the buffer layer 6 and the step of forming the opposed electrode 7 are carried out, thereby producing the solar cell 20.

Note that to the solar cell produced in this way, a weather-resistant protective film, an ultraviolet protective film, a gas barrier film, a getter material film, a sealing material, a back sheet, etc. may be further provided using a publicly-known technique.

EXAMPLES

Hereinafter, the present invention will be more specifically described by way of examples. However, the present invention is not limited to these examples.

[Preparation of Single-Walled Carbon Nanotube Film] (Aerosol Chemical Vapor Deposition Method)

A single-walled carbon nanotube (SWCNT) film was synthesized by the aerosol chemical vapor deposition method using a floating catalyst by ferrocene vapor decomposition under carbon monoxide atmosphere. Carbon monoxide gas at normal temperature was passed through a cartridge into which ferrocene powder was put, thereby obtaining catalyst precursor vapor. The fluid containing ferrocene vapor was passed through a water-cooled probe to be introduced into a high-temperature region of a ceramic tube reactor and mixed with additional carbon monoxide gas.

In order to obtain a stably-grown SWCNT film, a controlled amount of carbon dioxide can also be added to a carbon source (carbon monoxide). The SWCNT film was accumulated in the lower portion of the reactor using a nitrocellulose or silver membrane film (Millipore Corp., USA; HAWP, 0.45 μm pore diameter). In this way, the single-walled carbon nanotube film (SWCNT film) was prepared on the membrane film.

As the SWCNT film, 3 types of films respectively having different thicknesses were prepared. Specifically, 3 types of SWCNT films having light transmittance at 550 nm of 90%, 80% and 65%, respectively, were prepared.

[Example 1] Light-Transmitting Electrode

A glass substrate (light-transmitting substrate 1) (15×15 $mm^2$) was washed and dried in an oven at 70° C. Further, in order to remove an organic substance adhered to the substrate, UV-ozone treatment was carried out for 30 minutes immediately before a SWCNT film (carbon nanotube film 2) was put on the substrate.

The SWCNT film having a transmittance of 90% was cut into a predetermined size, and this SWCNT film was put into a device fabrication apparatus to which a glove box in which nitrogen gas was charged and a vacuum deposition apparatus were connected, and molybdenum oxide was vacuum deposited on the glass substrate. After that, the SWCNT film was transferred to the substrate, and molybdenum oxide was vacuum deposited thereon. The deposition rate during the vacuum deposition process was 0.02 nm/sec. Further, molybdenum oxide films (metal oxide film 3) formed on both the surfaces of the SWCNT film had a thickness of 10 nm. In this way, a light-transmitting electrode was prepared.

The light-receiving area is defined by the size of the cut carbon nanotube film. In this experiment, the carbon nanotube film was cut into a size of about 3 mm×3 mm (area: 9 $mm^2$).

[Examples 2 and 3] Light-Transmitting Electrode

A light-transmitting electrode was prepared under the same conditions as those in Example 1, except that as the SWCNT film, a SWCNT film having a transmittance of 80% was used (Example 2).

Similarly, a light-transmitting electrode was prepared under the same conditions as those in Example 1, except that as the SWCNT film, a SWCNT film having a transmittance of 65% was used (Example 3).

[Example 4] Solar Cell

An aqueous dispersion of poly-(3,4-ethylenedioxythiophene)-polystyrenesulfonic acid (PEDOT:PSS) (Clevios PVP, Heraeus Precious Metals GmbH & Co.) was applied onto the metal oxide film 3 of the light-transmitting electrode of Example 1 by spin coating, thereby forming a buffer layer 4.

10 mg of PTB7 (poly(thieno[3,4-b]thiophene/benzodithiophene)) was mixed with 15 mg of PC71BM ([6,6]-phenyl C71-butyric acid methyl ester), and the mixture was put into a solution obtained by mixing chlorobenzene with 1,8-diiodooctane at a volume ratio of 97:3 (0.970 mL and 0.030 mL, respectively). After that, the solution was stirred at 70° C. for 1 hour to completely dissolve the mixture in the solvent, thereby preparing an active layer solution.

The active layer solution obtained in this way was applied onto the buffer layer 4 by spin coating (2000 rpm, 90 sec), thereby forming an active layer 5 having a thickness of about 140 nm.

A buffer layer 6 of LiF (about 1 nm) was formed on the active layer 5 by means of vacuum deposition, and an opposed electrode 7 made of aluminium (100 nm) was formed by means of vacuum deposition, thereby preparing a solar cell.

Using a source meter (Keithley 2400), Voc (open end voltage), Jsc (short-circuit current density), FF (fill factor), Rs (series resistance), Rsh (shunt resistance) and PCE (energy conversion efficiency) were measured under a light blocking condition and under a condition of irradiation with simulated solar light (AM 1.5 G, 100 mW/cm$^2$; EMS-35AAA, Ushio Spax Inc.). The measurement results are shown in Table 1.

forming an active layer 5 having a thickness of about 80 nm. After that, it was thermally annealed at 150° C. for 14 minutes.

Under the same conditions as those in Example 4, a buffer layer 6 was formed on the active layer 5, and an opposed electrode 7 made of aluminium was formed by means of vacuum deposition, thereby preparing a solar cell.

Voc, etc. of the solar cell obtained in this way were measured in a manner similar to that in Example 4. The measurement results are shown in Table 1.

[Example 8] Solar Cell

A solar cell was prepared in a manner similar to that in Example 7, except that a buffer layer 4 was not formed on the light-transmitting electrode of Example 1 using PEDOT:PSS.

Voc, etc. of the solar cell obtained in this way were measured in a manner similar to that in Example 4. The measurement results are shown in Table 1.

[Example 9] Solar Cell

A solar cell was prepared under the same conditions as those in Example 4, except that a molybdenum oxide film was formed only on one surface of the carbon nanotube film, that is, a molybdenum oxide film was not formed between the light-transmitting substrate and the carbon nanotube film.

Voc, etc. of the solar cell obtained in this way were measured in a manner similar to that in Example 4. The measurement results are shown in Table 1.

TABLE 1

| | Light-transmitting substrate | Transmittance of SWCNT (%) | Active layer | $V_{OC}$ (V) | $J_{SC}$ (mA/cm$^2$) | FF (—) | Rs (Ω) | Rsh (Ω) | PCE (%) |
|---|---|---|---|---|---|---|---|---|---|
| Example 4 | Substrate of Example 1 | 90 | PTB7/PC71BM | 0.71 | 13.51 | 0.5 | 137 | 74600 | 4.79 |
| Example 5 | Substrate of Example 2 | 80 | PTB7/PC71BM | 0.73 | 13.79 | 0.57 | 116 | 9770 | 5.77 |
| Example 6 | Substrate of Example 3 | 65 | PTB7/PC71BM | 0.72 | 13.72 | 0.61 | 51.6 | 12200 | 6.04 |
| Example 7 | Substrate of Example 1 | 90 | P3HT/mix-PCBM | 0.60 | 8.15 | 0.43 | 142 | 8676 | 2.08 |
| Example 8 | Substrate of Example 1 | 90 | P3HT/mix-PCBM | 0.51 | 7.44 | 0.36 | 135 | 1767 | 1.34 |
| Example 9 | — | 90 | PTB7/PC71BM | 0.68 | 13.90 | 0.41 | 122 | 5575 | 3.86 |

[Examples 5-6] Solar Cell

A solar cell was prepared under the same conditions as those in Example 4, except that the light-transmitting electrode of Example 2 was used (Example 5). Further, a solar cell was prepared under the same conditions as those in Example 4, except that the light-transmitting electrode of Example 3 was used (Example 6). The measurement results of these solar cells are shown in Table 1.

When Examples 4-6 are compared to each other, it is considered that since a SWCNT film having a larger thickness (lower transmittance) has higher performance of controlling the movement of holes, FF (fill factor) is larger and PCE (energy conversion efficiency) is higher.

[Example 7] Solar Cell

In a manner similar to that in Example 4, an aqueous dispersion of poly-(3,4-ethylenedioxythiophene)-polystyrenesulfonic acid (PEDOT:PSS) (Clevios PVP, Heraeus Precious Metals GmbH & Co.) was applied onto the metal oxide film 3 of the light-transmitting electrode of Example 1 by spin coating, thereby forming a buffer layer 4.

P3HT (regioregular, Sigma Aldrich Chemical Co., Inc.) was mixed with mix-PCBM (Frontier Carbon Co., Nanom spectra E124) at a weight ratio of 5:3, and the mixture was put into o-dichlorobenzene (anhydrous, 99%, Sigma Aldrich Chemical Co., Inc.) at a concentration of 40 mg/mL. After that, the solution was stirred at 65° C. for 2 hours to completely dissolve the mixture in the solvent, thereby preparing an active layer solution.

The active layer solution obtained in this way was applied onto PEDOT:PSS of the light-transmitting electrode of Example 1 by spin coating (1500 rpm, 60 sec), thereby

[Example 10] Solar Cell

Figure 3:
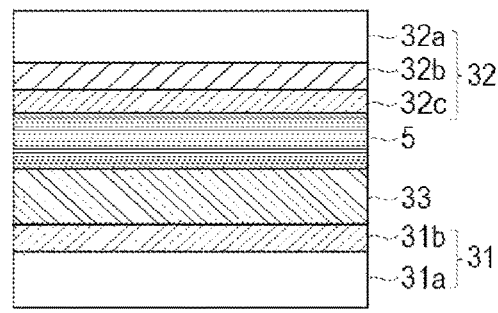
FIG. 3 is a schematic cross sectional view showing a solar cell in one working example of the present invention.

In Example 10 of the present invention, as the opposed electrode of the solar cell, an electrode 31, in which an ITO film 31b is formed on a glass substrate 31a, and a light-transmitting electrode 32, in which a single-walled carbon nanotube (SWCNT) film 32b doped with nitric acid is formed on a glass substrate 32a and an MoO$_3$ layer 32c is formed on the SWCNT film 32b, were used to prepare a solar cell 30 (FIG. 3). In the case of the solar cell 30, light can enter from both the side of the electrode 31 and the side of the light-transmitting electrode 32. The solar cell 30 was prepared in the below-described manner.

An electrode 31, in which an ITO film 31b is formed on a glass substrate 31a (Kuramoto Co., Ltd.), was prepared. The area of the active region of the electrode 31 was about 3 mm×3 mm, and the sheet resistance thereof was 6 Ω/square. The electrode 31 was subjected to ultrasonic cleaning for 15 minutes in a mixed solution of a cleaning agent for glass substrates (Yokohama Oils & Fats Industry Co., Ltd., product name: "Semiclean (registered trademark) M-LO"), water, acetone and 2-isopropanol, and then dried in an oven at 70° C. In order to remove remaining organic impurities, the electrode 31 was subjected to UV-ozone treatment for 30 minutes, and then put into a glove box filled with nitrogen.

A ZnO sol-gel film 33 was formed on the electrode 31 using the method reported by Heeger et al. (A. K. K. Kyaw, D. H. Wang, V. Gupta, J. Zhang, S. Chand, G. C. Bazan and A. J. Heeger, Advanced Materials, 2013, 25, 2397-2402), and it was baked at 200° C. After that, an active layer 5 was formed on the ZnO sol-gel film 33. The active layer 5 and the method for formation thereof are the same as those in Example 4 and therefore explanation thereof is omitted. In a vacuum thermal deposition apparatus, a molybdenum trioxide ($MoO_3$) layer 32c was deposited on the active layer 5 at an average rate of 0.2 Å/sec while performing annealing at 300° C. for 15 minutes.

Next, a SWCNT film 32b was transferred onto a glass substrate 32a, ethanol was dropped thereon to enhance adsorption, 70% aqueous solution of nitric acid ($HNO_3$) was dropped on the SWCNT film 32b and it was dried at 80° C., thereby obtaining a nitric acid-doped SWCNT film 32b. The glass substrate 32a on which the nitric acid-doped SWCNT film 32b was formed was transferred onto the $MoO_3$ layer 32c in a manner such that the SWCNT film 32b was provided onto the $MoO_3$ layer 32c, thereby forming a light-transmitting electrode 32. In this regard, in order to hold and enclose the substrate at the electrode 31 side after the formation of the $MoO_3$ layer 32c and the glass substrate 32a on which the SWCNT film 32b was formed, the end portions may be covered with an UV resin. The solar cell 30 was prepared in this way.

The solar cell 30 was taken out from the glove box, and PCE (energy conversion efficiency) of the solar cell 30 was measured. PCE was 4.58%.

Since both the electrodes (31, 32) of the solar cell of Example 10 have light-transmitting property, the solar cell itself has a certain level of light-transmitting property. Specifically, a part of light that enters from one surface of the solar cell exits from another surface of the solar cell. Accordingly, for example, when the solar cell is attached to glass or the like, electricity is generated by the solar cell while the inside of glass can be kept bright.

[Example 11] Solar Cell

Figure 4:
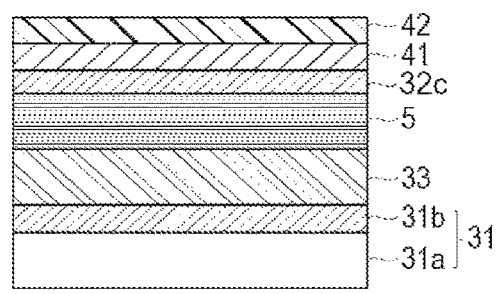
FIG. 4 is a schematic cross sectional view showing a solar cell in one working example of the present invention.

A solar cell 40 of Example 11 of the present invention has a structure in which a non-doped SWCNT film 41 is formed on the $MoO_3$ layer 32c of Example 10 and a PEDOT:PSS layer 42 is formed on the SWCNT film 41 (FIG. 4).

As explained in Example 10, a ZnO sol-gel film 33, an active layer 5 and a $MoO_3$ layer 32c were formed on an electrode 31, and a SWCNT film 41 was transferred onto the $MoO_3$ layer 32c. After that, a liquid of poly-(3,4-ethylenedioxythiophene)-polystyrenesulfonic acid (PEDOT:PSS) was dropped on the SWCNT film 41 and spin coating was carried out (4500 rpm, 60 sec), thereby forming a PEDOT:PSS layer 42 as a light-transmitting substrate on the SWCNT film 41.

PCE (energy conversion efficiency) of the solar cell 40 of Example 11 was measured. PCE was 3.77%.

[Example 12] Solar Cell

Figure 5:
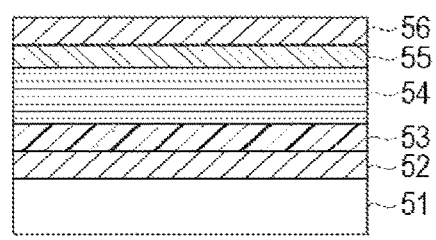
FIG. 5 is a schematic cross sectional view showing a solar cell in one working example of the present invention.

In Example 12 of the present invention, a perovskite compound is used for an active layer and as a light-transmitting electrode, a light-transmitting electrode including a SWCNT film doped with nitric acid and formed on a glass substrate (or PET substrate) was used to prepare a solar cell 50 (FIG. 5). The solar cell 50 was prepared in the below-described manner.

A glass substrate 51 was washed with a solution containing the above-described cleaning agent for glass substrates, and then subjected to UV-ozone treatment for 30 minutes to remove an unnecessary organic substance. Note that when using a resin film such as a polyethylene terephthalate (PET) film instead of the glass substrate 51, a solar cell having flexibility can be prepared. The substrate was put into a glove box filled with nitrogen, a SWCNT film 52 was transferred onto the glass substrate 51, ethanol was dropped thereon to enhance adsorption, 35% aqueous solution of nitric acid ($HNO_3$) was dropped on the SWCNT film 52 and it was dried at 80° C., thereby obtaining a nitric acid-doped SWCNT film 52. The present inventors found that doping of SWCNT with 35% $HNO_3$ can most efficiently improve the optical conductivity of SWCNT.

0.5% by mass of polyoxyethylene (6) tridecyl ether (Sigma Aldrich) was added to an aqueous dispersion of poly-(3,4-ethylenedioxythiophene)-polystyrenesulfonic acid (PEDOT:PSS) (Clevios PVP, Heraeus Precious Metals GmbH & Co.) to produce a surfactant-containing PEDOT:PSS. The liquid of surfactant-containing PEDOT:PSS produced was dropped on the SWCNT film 52 and spin coating was carried out (4500 rpm, 45 sec), thereby forming an improved PEDOT:PSS layer 53 on the SWCNT film 52. The improved PEDOT:PSS layer 53 functions as an electron blocking layer and also functions like a dopant similar to an organic thin-film solar cell.

A perovskite compound of an active layer was prepared in the below-described manner. 0.172 g of a $CH_3NH_3I$ compound and 0.500 g of a $PbI_2$ compound synthesized were added to 1.07 ml of anhydrous N,N-dimethylformamide, and the mixture was stirred overnight with the temperature being kept at 60° C. to produce a clear $CH_3NH_3PbI_3$ solution having a concentration of 45% by mass. 25 μl of the $CH_3NH_3PbI_3$ solution was dropped on the improved PEDOT:PSS layer 53, spin coating was carried out (4500 rpm, 8 sec), and then 10 μl of anhydrous chlorobenzene was rapidly dropped on the center portion of the substrate. Then the color of the substrate was changed from transparent to light brown. In this way, a perovskite layer 54 as the active layer was formed. Note that for the perovskite layer 54, compounds of $CH_3NH_3PbI_{3-x}Cl_x$ (in the formula, x is 1 to 3), $CH_3NH_3PbBr_3$, $CH_3NH_3PbBrI_2$, $CH_3NH_3PbBr_2I$, $CH_3NH_3SnBr_3$, $CH_3NH_3SnI_3$, $CH(=NH)NH_3PbI_3$, $(C_2H_5NH_3)_2PbI_4$, $(CH_2=CHNH_3)_2PbI_4$, $(CH\equiv CNH_3)_2PbI_4$, $(C_6H_5NH_3)_2PbI_4$, $(C_6H_3F_2NH_3)_2PbI_4$, $(C_6F_5NH_3)_2PbI_4$, $(C_4H_3SNH_3)_2PbI_4$, etc. may also be used. Preferably, the active layer of the solar cell 50 is made of a $CH_3NH_3PbI_3$ compound or $CH_3NH_3PbI_{3-x}Cl_x$ compound having a perovskite structure (in the formula, x is 1 to 3).

After that, a solution obtained by dissolving 20 mg of $PC_{61}BM$ in 1000 μl of chlorobenzene was dropped on the perovskite layer 54, and spin coating was carried out (1500 rpm, 30 sec), thereby forming a fullerene electron acceptor layer 55 as an electron transport layer. Finally, using a thermal deposition apparatus, an aluminium layer 56 having a thickness of 70 nm as a cathode was deposited on the fullerene electron acceptor layer 55, thereby preparing a solar cell 50.

The solar cell 50 was taken out from the glove box, and PCE (energy conversion efficiency) of the solar cell 50 was measured. PCE was 6.32%.

[Example 13] Solar Cell

In Example 13 of the present invention, when preparing a solar cell, only the glass substrate 51 of Example 12 was changed to a PET substrate, and the other layers 52-56 were the same as those of Example 12. When PCE of the solar cell of Example 13 was measured, it was 5.38%.

TABLE 2

| | Structure of electrode | Active layer | PCE (%) |
|---|---|---|---|
| Example 10 | cathode: glass substate/ITO film<br>anode: glass substate/SWCNT film/$MoO_3$ film | PTB7/PC71BM | 4.58 |
| Example 11 | cathode: glass substate/ITO film<br>anode: PEDOT:PSS layer/SWCNT film/$MoO_3$ film | PTB7/PC71BM | 3.77 |

TABLE 2-continued

| | Structure of electrode | Active layer | PCE (%) |
|---|---|---|---|
| Example 12 | cathode: aluminium layer<br>anode: glass substrate/nitric acid-doped SWCNT film | $CH_3NH_3PbI_3$ | 6.32 |
| Example 13 | cathode: aluminium layer<br>anode: PET substrate/nitric acid-doped SWCNT film | $CH_3NH_3PbI_3$ | 5.38 |

As shown in Examples 1-13, it was confirmed that the light-transmitting electrode according to the preferred embodiment of the present invention can impart high electrical conductivity and high electron blocking performance to the carbon nanotube film.

INDUSTRIAL APPLICABILITY

Examples of practical uses of the present invention include a solar cell.

EXPLANATIONS OF LETTERS OR NUMERALS 1 light-transmitting substrate
2 carbon nanotube film
3 metal oxide film
4 buffer layer
5 active layer
6 buffer layer
7 opposed electrode
10 light-transmitting electrode
20 solar cell
30 solar cell
40 solar cell
50 solar cell

The invention claimed is:

1. A solar cell, comprising:

a glass substrate;

a first molybdenum oxide film formed directly on the glass substrate;

a single-walled carbon nanotube film formed directly on the first molybdenum oxide film and having a transmittance of 65% to 90%;

a second molybdenum oxide film formed directly on the single-walled carbon nanotube film;

a poly-(3,4-ethylenedioxythiophene)-polystyrenesulfonic acid (PEDOT:PSS) layer formed directly on the second molybdenum oxide film, an active layer formed directly on the PEDOT:PSS layer and made of a mixture of poly(thieno[3,4-b]thiophene/benzodithiophene) (PTB7) and [6,6]-phenyl C71-butyric acid methyl ester (PC71BM);

a buffer layer of LiF formed directly on the active layer; and an electrode made of aluminum and formed directly on the buffer layer.

* * * * *

UNITED STATES PATENT AND TRADEMARK OFFICE
CERTIFICATE OF CORRECTION

| | | |
|---|---|---|
| PATENT NO. | : 10,930,442 B2 | Page 1 of 1 |
| APPLICATION NO. | : 15/507935 | |
| DATED | : February 23, 2021 | |
| INVENTOR(S) | : Shigeo Maruyama et al. | |

It is certified that error appears in the above-identified patent and that said Letters Patent is hereby corrected as shown below:

On the Title Page

Item (71) Applicants, after "Aalto University, Aalto (FI)" insert --; Denso Corporation (JP)--.

Signed and Sealed this
Eighth Day of June, 2021

Drew Hirshfeld
*Performing the Functions and Duties of the*
*Under Secretary of Commerce for Intellectual Property and*
*Director of the United States Patent and Trademark Office*